United States Patent
Chio et al.

(10) Patent No.: US 8,466,823 B2
(45) Date of Patent: Jun. 18, 2013

(54) CASCADE ANALOG-TO-DIGITAL CONVERTING SYSTEM

(75) Inventors: U-Fat Chio, Macau (CN); He-Gong Wei, Macau (CN); Yan Zhu, Macau (CN); Sai-Weng Sin, Macau (CN); Seng-Pan U, Macau (CN); Rui Paulo da Silva Martins, Macau (CN); Franco Maloberti, Torre d'Isola (IT)

(73) Assignee: University of Macau, Macau (CN)

( * ) Notice: Subject to any disclaimer, the term of this patent is extended or adjusted under 35 U.S.C. 154(b) by 32 days.

(21) Appl. No.: 13/198,856

(22) Filed: Aug. 5, 2011

(65) Prior Publication Data

US 2012/0194364 A1 Aug. 2, 2012

(30) Foreign Application Priority Data

Feb. 1, 2011 (TW) .............................. 100103984 A

(51) Int. Cl.
*H03M 1/12* (2006.01)
(52) U.S. Cl.
USPC ............ 341/156; 341/155; 341/159; 341/163
(58) Field of Classification Search
USPC .......................................... 341/155–156, 159
See application file for complete search history.

(56) References Cited

U.S. PATENT DOCUMENTS

| | | | | |
|---|---|---|---|---|
| 4,612,533 A | * | 9/1986 | Evans | 341/120 |
| 4,994,806 A | * | 2/1991 | Yun-Tae | 341/155 |
| 5,581,255 A | * | 12/1996 | Hsu | 341/156 |
| 6,404,373 B1 | * | 6/2002 | Yu et al. | 341/155 |
| 6,404,374 B1 | * | 6/2002 | Yu et al. | 341/159 |
| 7,187,317 B2 | * | 3/2007 | Oka | 341/156 |

OTHER PUBLICATIONS

Publication of IEEE Transactions on Circuits and Systems—II: Express Briefs, vol. 57, No. 8, Aug. 2010 entitled Design and Experimental Verification of a Power Effective Flash—SAR Subranging ADS, pp. 607-611.

* cited by examiner

*Primary Examiner* — Khai M Nguyen

(74) *Attorney, Agent, or Firm* — Bacon & Thomas, PLLC

(57) ABSTRACT

A novel analog-to-digital converter (ADC) system using a two-step conversion is disclosed. The ADC system is capable of achieving high sampling rate, low power consumption and low complexity. The new proposed ADC is formed by cascading a flash ADC having high sampling rate and low resolution with a successive approximation (SA) ADC having low power consumption and low sampling rate.

4 Claims, 2 Drawing Sheets

CASCADE ANALOG-TO-DIGITAL CONVERTING SYSTEM

BACKGROUND OF THE INVENTION

1. Field of the Invention

The present invention generally relates to an analog-to-digital converting system, and more particularly, to an analog-to-digital converting system by using a cascade of flash analog-to-digital converter and a successive approximation analog-to-digital converter.

2. Description of Related Art

Analog-to-digital converters (ADC) have various architectures, for example, flash analog-to-digital converters (flash ADC), pipeline analog-to-digital converters (pipeline ADC), and successive approximation analog-to-digital converters (SA ADC), all of which respectively have suitable application fields.

Flash ADC is typically the fastest, but has the highest implementation cost. In an N-bit ADC, there are $2^N$ possible digital number outputs. A total of $2^N-1$ boundaries define the analog input ranges corresponding to the digital number outputs. In flash ADC, $2^N-1$ analog reference signals are generated. An input is simultaneously compared to each reference signal. The $2^N-1$ comparators produce digital output signals which are decoded to produce the desired digital output number.

Flash ADC is fast because the input-to-output delay includes the reaction times of one comparator stage and the subsequent decoding logic. Flash ADC is costly to implement, because the number of analog reference signals and comparators grows exponentially with N.

SA ADC is considerably slower than flash ADC, but has a much lower implementation cost for large N. In successive approximation, a binary-tree search is performed on the possible digital output numbers. The binary-tree search proceeds in a sequence of N approximation steps. At each step, a possible digital output number is passed to an N-bit digital-to-analog (D/A) converter, which produces a corresponding analog value. This value is compared to the analog input signal. The result of the comparison is used to select a new possible digital number value for the following step.

With respect to components, an N-bit SA ADC requires one comparator, an N-bit D/A converter, and logic circuits for directing the search and storing the results. The converter and the comparator can be re-used for each step of the search. The speed of the SA converter depends on N and on the settling times of the comparator, the D/A converter, and the logic circuits. For instance, a 12-bit SA ADC would require 12 comparison steps of 12 separate 12-bit D/A conversion results, while an 8-bit SA A/D conversion would require only 8 comparison steps of 8 separate D/A conversion results.

The principle disadvantages of prior art flash ADCs are that while they are fast, they typically need a large number of components which use a great deal of chip space and which consume a large amount of power. The exponential increase in component counts and power consumption of flash ADCs limits the number of bits for which such converters are economically feasible to use. The principle disadvantages of SA ADCs are that while they have low component cost and are economical for higher precision than are flash ADCs, they are quite slow and make inefficient use of the resources consumed. It is therefore an object of the present invention to provide a novel ADC which is fast and which has low complexity.

SUMMARY OF THE INVENTION

Accordingly, the object of the present invention is to provide an analog-to-digital converting system for converting an analog input signal into a digital output signal. The analog-to-digital converting system for converting an analog input signal into a digital output signal includes a track-and-hold circuit for tracking the input signal during a track mode and holding the tracked input signal during a hold mode; a reference voltage generator for generating a first reference voltage and a second reference voltage; a coarse analog-to-digital converter for converting an output signal of the track-and-hold circuit into a first digital code and having a first digital-to-analog converter for converting the first digital code into a first analog signal, wherein the first digital code is related to a most-significant-bit set of the digital output signal of the analog-to-digital converting system; a subtractor for converting the first digital code into a first analog signal and subtracting said first analog signal from said output signal of the track-and-hold circuit; a fine analog-to-digital conversion means for converting an output signal of the subtractor into a second digital code according to the second reference voltage, wherein the second digital code is related to a least-significant-bit set of the digital output signal of the analog-to-digital converting system.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE BEST EMBODIMENT

Figure 1:
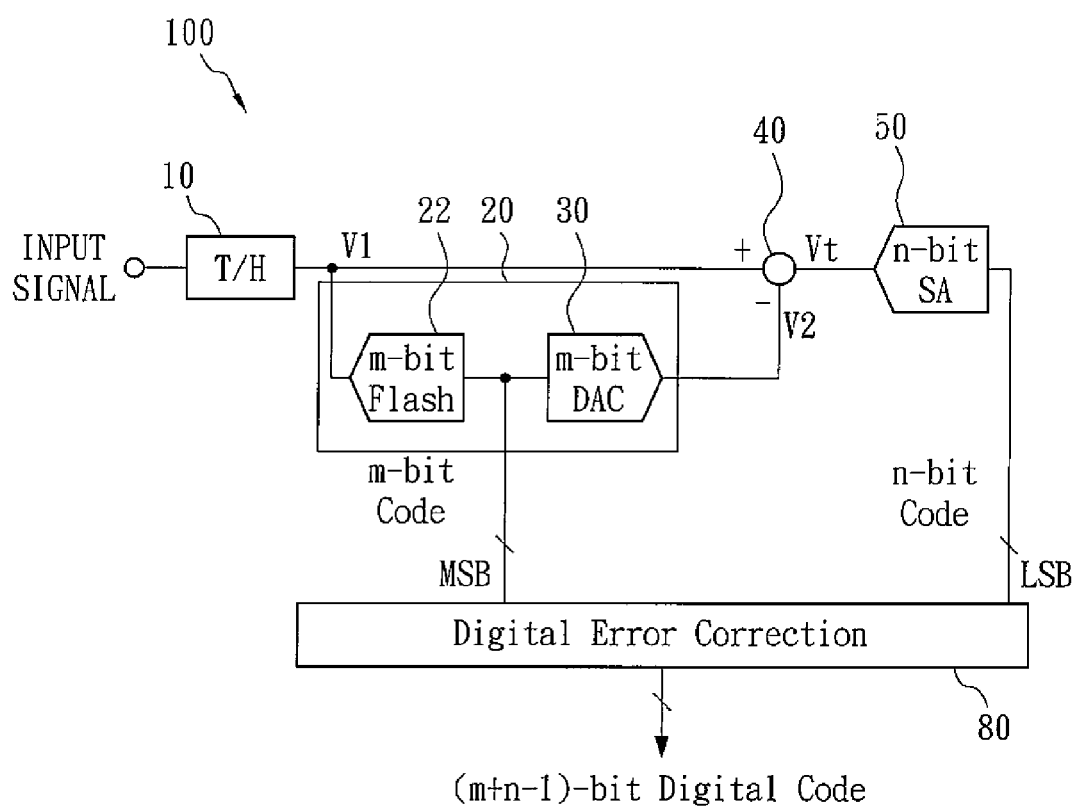
FIG. 1 is block diagram of the analog-to-digital converting system provided by the present invention.

Reference will now be made in detail to the present preferred embodiment of the invention, which is illustrated in the accompanying drawings. Wherever possible, the same reference numbers are used in the drawings and the description to refer to the same or like parts.

In the this embodiment of the present invention, the analog-to-digital converting (ADC) system adopts subranging technique based on the two-steps architecture, wherein the coarse ADC takes a flash ADC architecture, while the fine ADC takes an SA ADC architecture. Thus, the present invention is advantageous in high speed sampling frequency and low power consumption.

Referring to FIG. 1, which is a circuit block diagram of an ADC system 100 for outputting a (m+n−1)-bit digital code according to the present invention. The ADC system 100 of FIG. 1 includes a track-and-hold circuit (T/H circuit) 10, a coarse ADC 20, a subtractor 40, a fine ADC 50 and a digital error correction unit 80.

During a track mode, the T/H circuit 10 would track an input signal. During a hold mode, the T/H circuit 10 would hold the tracked input signal and deliver the input signal to rear-stage circuits (the coarse ADC 20, the subtractor 40 and the fine ADC 50).

The coarse ADC 20 receives the output signal V1 of the T/H circuit 10, conducts high bit data-converting to generate digital code MSBs and delivers the digital code MSBs to the digital error correction unit 80. The code MSBs is related to the most-significant-bit set MSBs of the final result (m+n−1)-bit digital code. The coarse ADC 20 includes an m-bit flash ADC 22 and an m-bit digital-to-analog converter (DAC) 30 connected for determining the m-bit code MSB and for outputting an analog signal V2 corresponding to the MSBs of the final result (m+n−1)-bit digital code.

The subtractor 40 receives the sampled analog signal V1 from the T/H circuit 10 and the analog signal V2 from the m-bit DAC 30 subtracted from the received signal V1 such that an analog signal Vt corresponding to the LSBs of the final result (m+n−1)-bit digital code.

The fine ADC 50 is of an n-bit successive approximation converter which receives the analog signal Vt from the subtractor 40. The n-bit SA ADC 50 then quantizes the analog signal Vt to an n-bit LSB code.

The digital error correction unit 80 combines codes MSBs and LSBs (generated by the flash ADC 22 and SA ADC 50, respectively), wherein a final result of (m+n−1)-bit digital code is generated.

Figure 2:
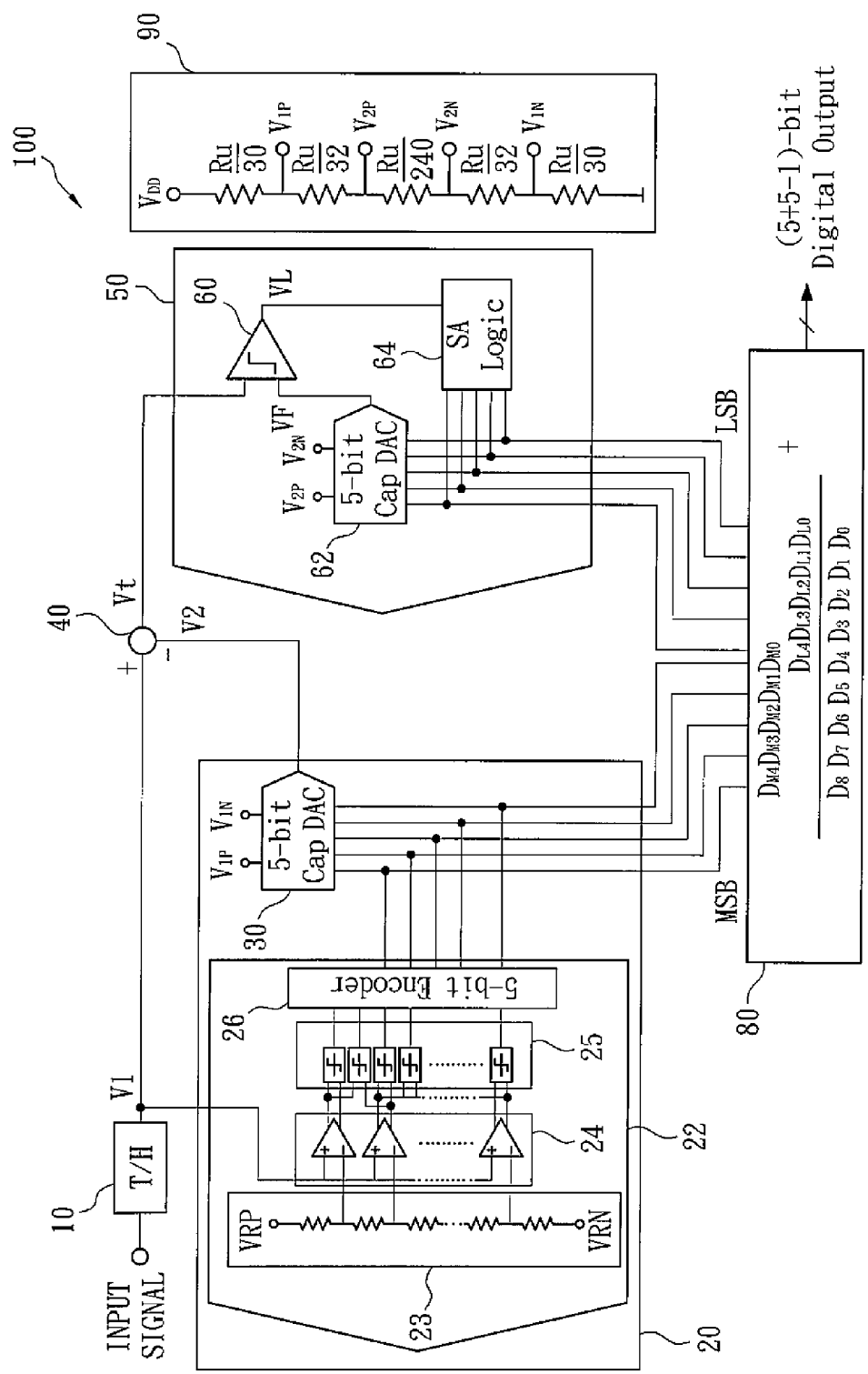
FIG. 2 is an illustrative circuit diagram of the analog-to-digital converting system of FIG. 1.

FIG. 2 shows a detailed circuit diagram of the ADC system 100 of FIG. 1. This ADC system 100 is described as a 9-bit flash-SA subranging ADC, wherein the flash ADC 22 and the SA ADC 50 are respectively implemented with a 5-bit configuration.

The T/H circuit 10 samples the continuous input signal to a discrete signal V1. The 5-bit flash ADC 22 includes a reference ladder circuit 23, preamplifiers 24, comparators 25 and a 5-bit encoder 26 connected in a serial configuration.

The reference ladder circuit 23 provides suitable reference voltages each of which is supplied to an inverter (−) input terminal of a respective preamplifier of the preamplifiers 24. The discrete signal V1 is connected to non-inverted (+) terminals of each of preamplifiers 24. The comparators 25 then quantize the output signals of preamplifiers 24 to a thermometer code. The 5-bit encoder 26 transforms the thermometer code into a 5-bit course code MSB for outputting to the digital error correction unit 80.

As shown, the 5-bit DAC 30 generates an analog voltage V2 by capacitively switching the 5-bit course code MSB from the 5-bit encoder 26. The subtractor 40 receives the sampled analog signal V1 from the T/H circuit 10 and the analog signal V2 from the m-bit DAC 30 and outputs the analog signal Vt.

The SA ADC 50 includes a comparator 60, a 5-bit capacitive DAC 62 and a SA logic circuit 64. The 5-bit capacitive DAC 62 generates a reference voltage VF. The comparator 60 compares the output signal Vt from the subtractor 40 with the reference voltage VF from the capacitive DAC 62 and outputs an analog signal VL. The SA logic circuit 64 receives the analog signal VL and quantizes it as a 5-bit fine code LSB for outputting to the capacitive DAC 62 and the digital error correction unit 80.

The outputs of the code MSBs and LSBs (generated by the flash ADC 22 and SA ADC 50) are added in the digital error correction unit 80 by overlapping the most-significant-bit ($D_{L4}$) of the code LSB and the least-significant-bit ($D_{M0}$) of the code MSB, so that the overall digital output is a 9-bit ($D_0$-$D_8$) digital signal.

As shown in FIG. 2, in addition to T/H circuit 10, coarse ADC 20, fine ADC 50 and digital error correction unit 80 illustrated in FIG. 1, ADC system 100 of the present invention further includes an on-chip reference voltage generator 90 generates stable reference voltages V1P, V1N for capacitive DAC 30 and V2P and V2N for capacitive DAC 62.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog-to-digital converting system for converting an analog input signal into a digital output signal, comprising:
    a track-and-hold circuit for tracking the input signal during a track mode and holding the tracked input signal during a hold mode;
    a reference voltage generator for generating a first reference voltage and a second reference voltage;
    a flash analog-to-digital converter for converting an output signal of the track-and-hold circuit into a first digital code and having a first digital-to-analog converter for converting the first digital code into a first analog signal, wherein the first digital code is related to a most-significant-bit set of the digital output signal of the analog-to-digital converting system;
    a subtractor for subtracting said first analog signal from said output signal of the track-and-hold circuit;
    a successive approximation analog-to-digital converter for converting an output signal of the subtractor into a second digital code according to the second reference voltage, wherein the second digital code is related to a least-significant-bit set of the digital output signal of the analog-to-digital converting system; and
    an error correction circuit for combining the most-significant-bit set and the least-significant-bit set by overlapping the most-significant-bit of the least-significant-bit set and the least-significant-bit of the most-significant-bit set of the digital output signal of the analog-to-digital converting system as to generate the digital output signal.

2. The analog-to-digital converting system according to claim 1, wherein the successive approximation analog-to-digital converter comprises:
    a second digital-to-analog converter for converting the second digital code into a second analog signal;
    a comparator for comparing the second analog signal with an output signal of the subtractor; and
    a successive approximation logic circuit for converting an output signal of the comparator into the second digital code.

3. The analog-to-digital converting system according to claim 1, wherein the flash analog-to-digital converter comprises: a reference ladder circuit for generating a plurality of reference voltages; a plurality of preamplifiers each comparing a reference voltage from the reference ladder circuit with the analog signal; and a corresponding plurality of comparators.

4. The analog-to-digital converting system according to claim 3, wherein the flash A/D converter creates a thermometer code based on a comparison result of the plurality of comparators.

* * * * *